US012712511B2

(12) United States Patent
Golyshko

(10) Patent No.: US 12,712,511 B2
(45) Date of Patent: Aug. 18, 2026

(54) DYNAMIC AUDIO VOLUME LEVELING NOTIFICATION SYSTEM

(71) Applicant: Roku, Inc., San Jose, CA (US)

(72) Inventor: Philip Johnson Golyshko, Westminster, CO (US)

(73) Assignee: Roku, Inc., San Jose, CA (US)

(*) Notice: Subject to any disclaimer, the term of this patent is extended or adjusted under 35 U.S.C. 154(b) by 134 days.

(21) Appl. No.: 18/915,606

(22) Filed: Oct. 15, 2024

(65) Prior Publication Data

US 2026/0106592 A1 Apr. 16, 2026

(51) Int. Cl.
*H03G 3/32* (2006.01)
*H04N 21/475* (2011.01)

(52) U.S. Cl.
CPC .......... *H03G 3/32* (2013.01); *H04N 21/4758* (2013.01)

(58) Field of Classification Search
CPC ............................ H03G 3/32; H04N 21/4758
USPC ........................................................ 381/107
See application file for complete search history.

(56) References Cited

U.S. PATENT DOCUMENTS

2025/0364963 A1* 11/2025 Ellison .................. H03G 7/005

* cited by examiner

*Primary Examiner* — Paul Kim
(74) *Attorney, Agent, or Firm* — Akona IP PC

(57) ABSTRACT

A computer-implemented method is described and includes monitoring an audio signal received at a television to detect a sustained increase in a perceived loudness of the audio signal; subsequent to the detecting, providing a notification to a user regarding availability of a television volume leveling function; and subsequent to receiving from the user a response to the notification, wherein the response indicates an approval to activate the television volume leveling function, activating the volume leveling function. In particular embodiments, the monitoring is performed using Loudness Units relative to Full Scale (LUFS).

20 Claims, 7 Drawing Sheets

DYNAMIC AUDIO VOLUME LEVELING NOTIFICATION SYSTEM

TECHNICAL FIELD

This disclosure relates to televisions, and more specifically, to a dynamic audio volume leveling notification system for televisions.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Overview

Figure 1:
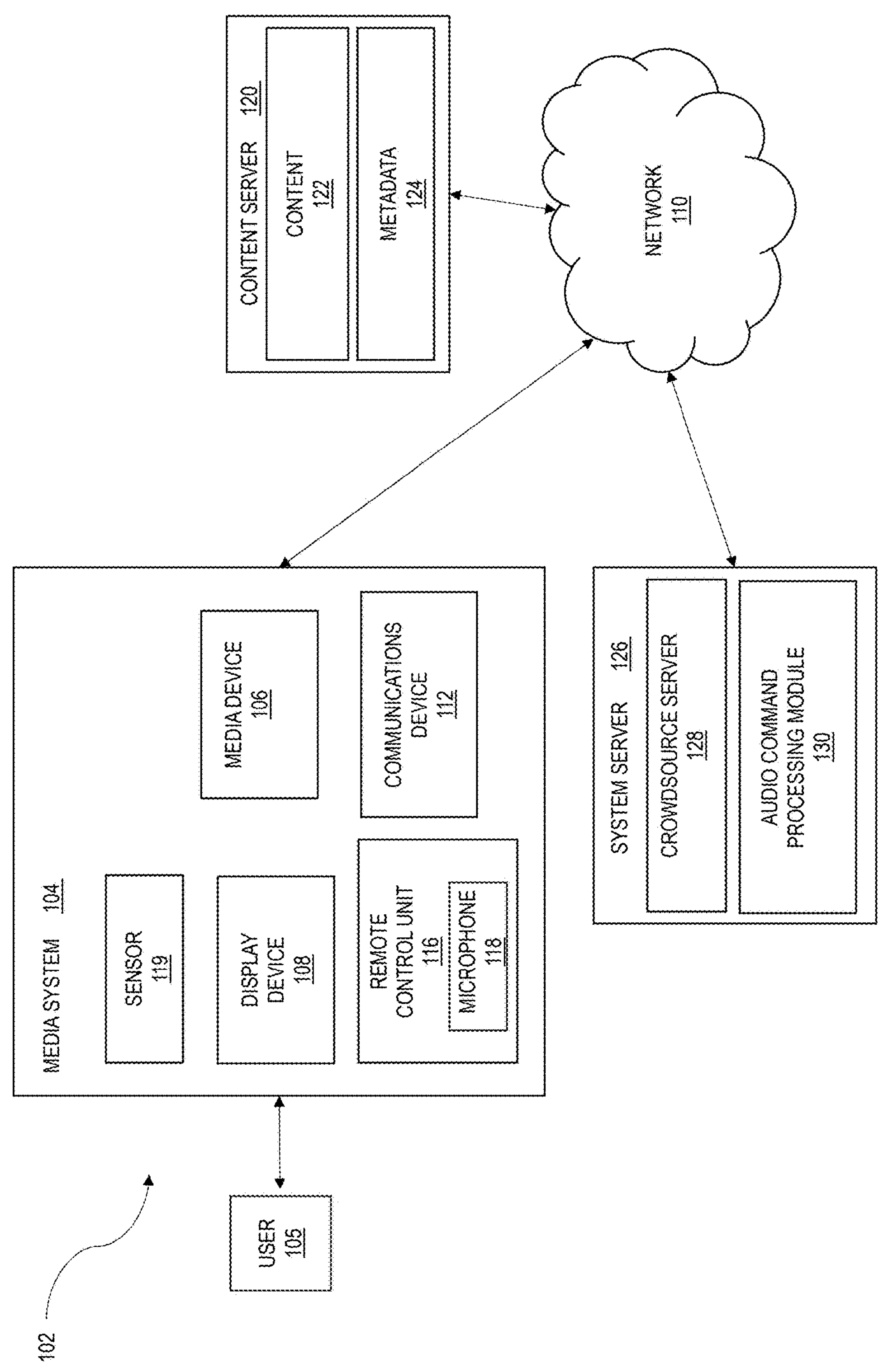
FIG. 1 illustrates a block diagram of an example multimedia system, according to some embodiments of the disclosure.

Multimedia systems, such as digital streaming platforms, typically include a television for presenting media content (including audio and/or video content) to a user. Ad-supported content providers typically seek to attract users to entertain them (through media content) and/or sell them products (through advertisements). This dual purpose has often resulted in a difference in sound levels, or volume, between content audio and advertisement audio. In particular, during a period that has become known as the "loudness wars," content providers completed to have the loudest advertisements possible to attract users' attention. Although regulations have been implemented to attempt to address this problem, some advertisers and content providers continue to manipulate audio levels in order to grab the attention of users.

In accordance with features of embodiments described herein, a dynamic audio volume leveling notification (DAVLN) system dynamically monitors the perceived loudness of an audio signal using Loudness Units relative to Full Scale (LUFS) at an output stage before the audio signal is output the speakers. As will be described in further detail below, the DAVLN system detects significant and sustained changes in loudness, distinguishing between typical variations in content audio and increased audio associated with advertisements presented during commercial breaks in the content. When a substantial change in perceived loudness is detected by the DAVLN system, a notification is provided (e.g., on the television display) to prompt the user to enable the television's volume leveling feature. In particular embodiments, the DAVLN system provides the notification at appropriate times (e.g., during natural breaks in content, such as commercial breaks, or when the content is paused, for example) to avoid disrupting the user's viewing experience.

Loudness refers to the perceived intensity or volume of a sound to the human ear. Unlike pure volume, which can be measured objectively using instruments, loudness is subjective and can vary based on the experience of the listener and the frequency and duration of the sound. Loudness can be measured in short bursts (peak loudness), such as a random burst of laughter, and over time (constant loudness), such as a steady voiceover of a narrator.

As will be recognized by one of ordinary skill in the art, LUFS is a standardized measurement of audio loudness that factors human perception and electrical signal intensity together. In LUFS, "full scale" is the maximum level a particular system can handle. LUFS are currently one of the most precise ways to measure perceived loudness in audio signals. With LUFS, two songs that have identical LUFS readings sound like they are at the same level regardless of their Peak and RMS readings. LUFS read in negative numbers (e.g., −6 LUFS, −11 LUFS, and −16 LUFS), such that the farther from zero, the quieter the audio and the closer to zero, the louder the audio. In summary, LUFS assesses the average loudness over an entire audio track by weighting frequencies based on human hearing sensitivity, resulting in a measurement that mirrors a user's subjective experience of loudness.

Example Multimedia System

FIG. 1 illustrates a block diagram of an example multimedia system 102 according to some embodiments described herein. In a non-limiting example, multimedia system 102 may be directed to digital streaming media; however, embodiments described herein may be applicable to any type of media instead of or in addition to streaming media, as well as any type of mechanism, means, protocol, method, and/or process for distributing media.

Multimedia system 102 may include one or more media systems, such as media system 104. Media system 104 may represent a family room, a kitchen, a backyard, a home theater, a school classroom, a library, a car, a boat, a bus, a plane, a stadium, a movie theater, an auditorium, a bar, a restaurant, an extended reality (XR) space, and/or any other location or space where it may be desirable to receive, interact with, and/or play streaming content. Users, such as a user 105, may interact with media system 104 as described herein to select, view, interact with, and/or otherwise consume content.

Each media system 104 may include one or more media devices, such as media device 106, each of which may be coupled to one or more display devices, such as display device 108 (which may be implemented as an A/V device). It will be noted that terms such as "coupled," "connected," "attached," "linked," "combined," as well as similar terms, may refer to physical, electrical, magnetic, local, and/or other types of connections, unless otherwise specified herein.

Media device 106 may include a streaming media device, DVD or BLU-RAY device, audio/video playback device, cable box, an XR device (which may include one or more of a VR device, an AR device, and an MR device), and/or digital video recording device, for example. Display device 108 may include a monitor, a television, a computer, a smart phone, a tablet, a wearable (e.g., a watch, glasses, goggles and/or an XR headset), an appliance, an Internet of things (IoT) device, and/or a projector, for example. In some embodiments, media device 106 may be a part of, integrated with, operatively coupled to, and/or connected to one or more respective display devices, such as display device 108.

Media device 106 may be configured to communicate with network 110 via a communications device 112. Communications device 112 may include, for example, a cable modem or satellite television transceiver. Media device 106 may communicate with the communications device 112 over a link that may include wireless (e.g., Wi-Fi) and/or wired connections.

In various embodiments, network 110 may include, without limitation, wired and/or wireless intranet, extranet Internet, cellular, Bluetooth, infrared, and/or any other short range, long range, local, regional, and/or global communications mechanism, means, approach, protocol, and/or network, as well as any combinations thereof.

Media system 104 may include a remote control device 116. Remote control device may include and/or be incorporated into any component, part, apparatus, and/or method for controlling media device 106 and/or display device 108, such as a remote control, a tablet, a laptop computer, a smartphone, a wearable, on-screen controls, integrated control buttons, audio controls, XR equipment, and/or any combination thereof, for example, In one embodiment, remote control device 116 wirelessly communicates with media device 106 and/or display device 108 using any wireless communications protocol. Remote control device 116 may include a microphone 118. Media system 104 may also include one or more sensors, such as sensor 119, which may be deployed for tracking movement of user 105, such as in connection with XR applications. In particular embodiments, sensor 119 may include one or more of a gyroscope, a motion sensor, a camera, an IMU, and a biometric sensor, for example. Sensor 119 may also include one or more sensing devices for sensing biometric characteristics associated with sympathetic arousal, including one or more of heart rate variability (HRV), electrodermal activity (EDA), pupil opening, and/or eye movement. In some embodiments, sensors, such as sensor 119, may be incorporated into a device to be worn by users, such as a headset or vest. In particular embodiments, sensor 119 may comprise any sort of XR device.

Multimedia system 102 may include a plurality of content servers 120, which may also be referred to as content providers or sources. Although only one content server 120 is shown in FIG. 1, multimedia system 102 may include any number of content servers 120, each of which may be configured to communicate with network 110. Content servers 120 may be managed by one or more content providers. Each content server 120 may store content 122 and metadata 124. Content 122 may include media content, such as audio content, video content, image content, XR (e.g., VR, AR, and/or MR) content, gaming application content, advertising content, software content, and/or any other content or data objects in electronic form. Features or attributes of content 122 may include but are not limited to popularity, topicality, trend, statistical change, most-talked or most-discussed about, critics ratings, viewers ratings, length/duration, demographic-specific popularity, segment-specific popularity, region-specific popularity, cost associated with a content item, revenue associated with a content item, subscription associated with a content item, and amount of advertising, for example.

In particular embodiments, metadata 124 may include data about content 122. For example, metadata 124 may include but is not limited to such information pertaining or relating to content 122 as plot line, synopsis, director, list of actors, list of artists, list of athletes/teams, list of writers, list of characters, length of content item, language of content item, country of origin of content item, genre, category, tags, presence of advertising content, viewers' ratings, critic's ratings, parental ratings, production company, release date, release year, platform on which the content item is released, whether it is part of a franchise or series, type of content item, sports scores, viewership, popularity score, minority group diversity rating, audio channel information, availability of subtitles, beats per minute, list of filming locations, list of awards, list of award nominations, seasonality information, scene and video understanding, and emotional understanding of the scene based on visual and dialogue cues, for example. Metadata 124 may additionally or alternatively include links to any such information pertaining to or relating to content 122. Metadata 124 may additionally or alternatively include one or more indices of content 122.

Multimedia system 102 may include one or more system servers 126, which operate to support media devices 106 from the cloud. In particular embodiments, structural and functional aspects of system servers 126 may wholly or partially exist in the same or different ones of system servers 126.

Media devices, such as media device 106, may exist in numerous media systems, such as media system 104. Accordingly, media devices 106 may lend themselves to crowd sourcing embodiments and system servers 126 may include one or more crowdsource servers 128. System servers 126 may also include an audio command processing module 130. As noted above, remote control device 116 may include a microphone 118, which may receive audio data from user 105 as well as from other sources, such as display device 108. In some embodiments, media device 106 may be audio responsive and the audio data may represent verbal commands from user 105 to control media device 106 as well as other components in media system 104, such as display device 108.

In some embodiments audio data received by microphone 118 is transferred to media device 106, which is then forwarded to audio command processing module 130. The audio command processing module 130 may operate to process and analyze the received audio data to recognize a verbal command from user 105. Audio command processing module 130 may then forward the verbal command to media device 106 for processing. In some embodiments, audio data may be additionally or alternatively processed and analyzed by an audio command processing module in media device 106 and system servers 126 may cooperate to select one of the verbal commands to process.

Example Television for Use in Multimedia System

Figure 2:
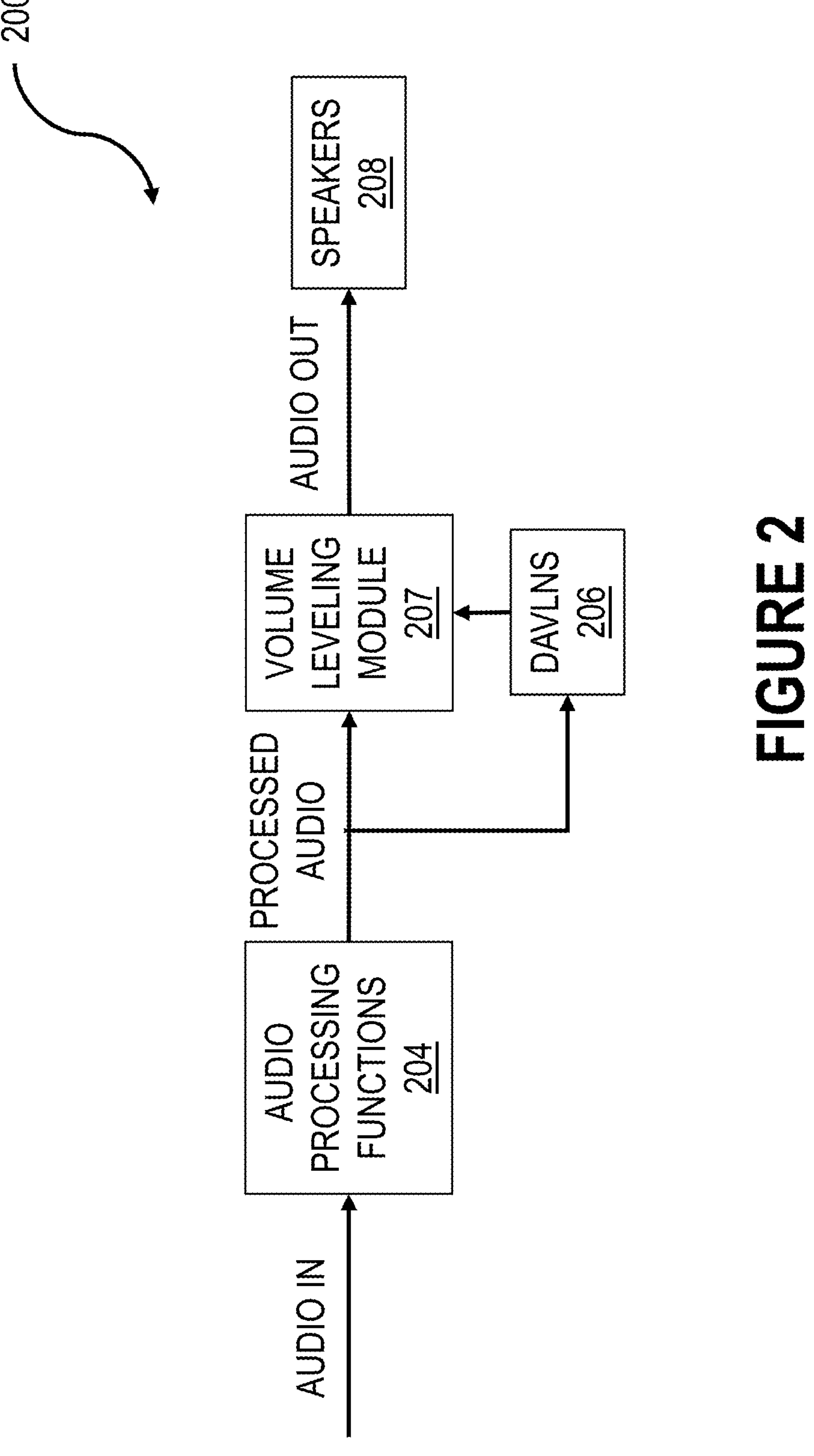
FIG. 2 illustrates a block diagram of an example television including a dynamic audio volume leveling notification (DAVNL) system, according to some embodiments of the disclosure.

FIG. 2 illustrates a block diagram of an example television 200, which may be implemented in multimedia system 102 as display device 108, for example. Referring now to both FIGS. 1 and 2, in some embodiments, user 105 may interact with display device 108 (e.g., television 200) using, for example, remote control device 116. For example, user 105 may use remote control device 116 to interact with a user interface of the display device 108 to select content, such as a movie, television show, music, book, application, game, etc. The selected content may be requested from content servers 120 over network 110. Content servers 120 may transmit the requested content to the media device 106. Media device 106 may transmit the received content to the display device 108 for playback to user 105.

As shown in FIG. 2, television 200 includes audio processing functions 204 for processing audio signals input to the television. Such processing functions may include, but are not limited to, the use of algorithms and techniques to modify and enhance audio signals.

Once the audio signal is processed, it is input to a DAVLN system 206. As described in greater detail below with reference to FIGS. 4, 5A, and 5B, the DAVLN system 206 monitors the signal to detect prolonged spikes in perceived loudness of the signal using LUFS, such as may be caused by commercial audio, and upon detection of such a prolonged spike in perceived loudness, may prompt the user to indicate whether they would like to activate a volume leveling function 207. In alternative embodiments, the volume leveling function 207 may be automatically automated by the DAVLN system 206 upon detection of a prolonged spike in perceived loudness of the audio signal.

The processed audio signal is also input to the volume leveling function 207. In particular embodiments, volume leveling maintains the volume of the audio signal consistent across different types of entertainment that the user does not need to adjust the volume when the user changes channels and/or a commercial comes on. While the volume leveling function 207 is activated, the audio signals are processed (e.g., compressed) to limit the amplitude of the audio signals to a predetermined threshold value. Audio signals output from the volume leveling function 207 are provided to one or more speakers 208 for presentation to the user in a conventional fashion.

Example DAVNL System

Figure 3:
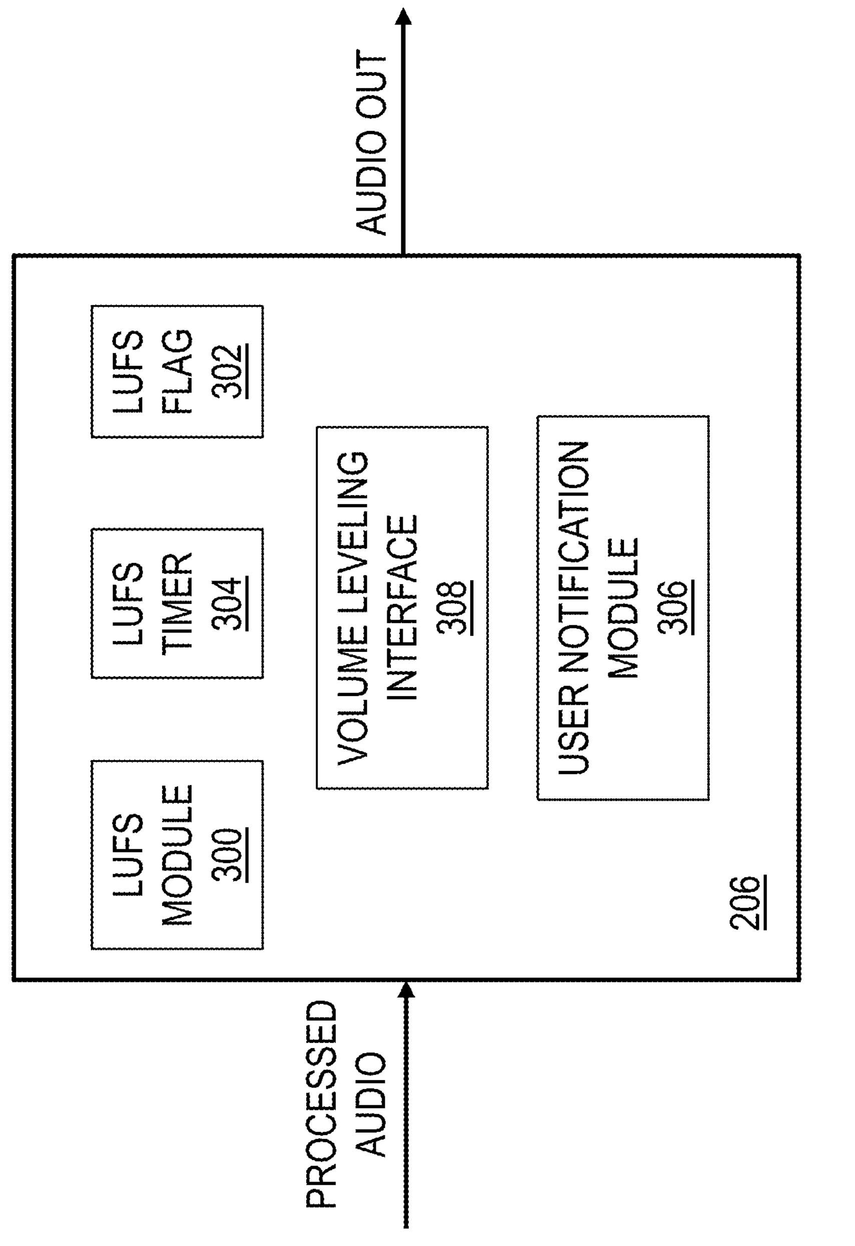
FIG. 3 illustrates a more detailed block diagram of the DAVNL system of FIG. 2, according to some embodiments of the disclosure.

FIG. 3 illustrates a more detailed block diagram of DAVNL system 206 shown in FIG. 2. As shown in FIG. 3, in one example embodiment, DAVNL system 206 includes a LUFS module 300 (which may include a LUFS meter), a LUFS flag 302, a LUFS timer 304, a user notification module 306, and a volume leveling interface 308. As will be described in greater detail below, LUFS module receives the processed audio signals and determines whether the audio exceeds a predetermined LUFS threshold value. In other words, the LUFS module detects a spike in the perceived loudness of the processed audio. Such a spike may be due, for example, to a transition from content audio to commercial audio. In order to ensure that the spike is not simply a momentary spike in content audio, upon detection of a spike, the audio is monitored to determine that the increase in perceived loudness lasts a particular amount of time. In one implementation, LUFS flag 302 may be set and LUFS timer 304 (which may be implemented as a countdown timer) is started upon detection of the increase in perceived loudness. Additional details concerning operation of the LUFS module 300, LUFS flag 302, and LUFS timer 304 will be described below with reference to FIGS. 4, 5A, and 5B.

User notification module 306 is configured to provide a notification to the user regarding the existence of volume leveling functionality and to elicit a response from the user regarding whether the user would like to activate the volume leveling functionality in response to detection by LUFS module 300 (e.g., in conjunction with LUFS flag 302 and LUFS counter 304) of a spike in perceived loudness of the audio signal. For example, user notification module 306 may cause to be displayed to the user a message notifying the user that volume leveling is available and requesting the user to indicate (e.g., by selecting a YES or a NO button displayed along with the message) whether the user would like to activate volume leveling.

Volume leveling interface 308 is configured to interface with volume leveling module 207 of television 200 to activate volume leveling responsive to a positive response from the user to the notification displayed by user notification module 306.

Figure 4:
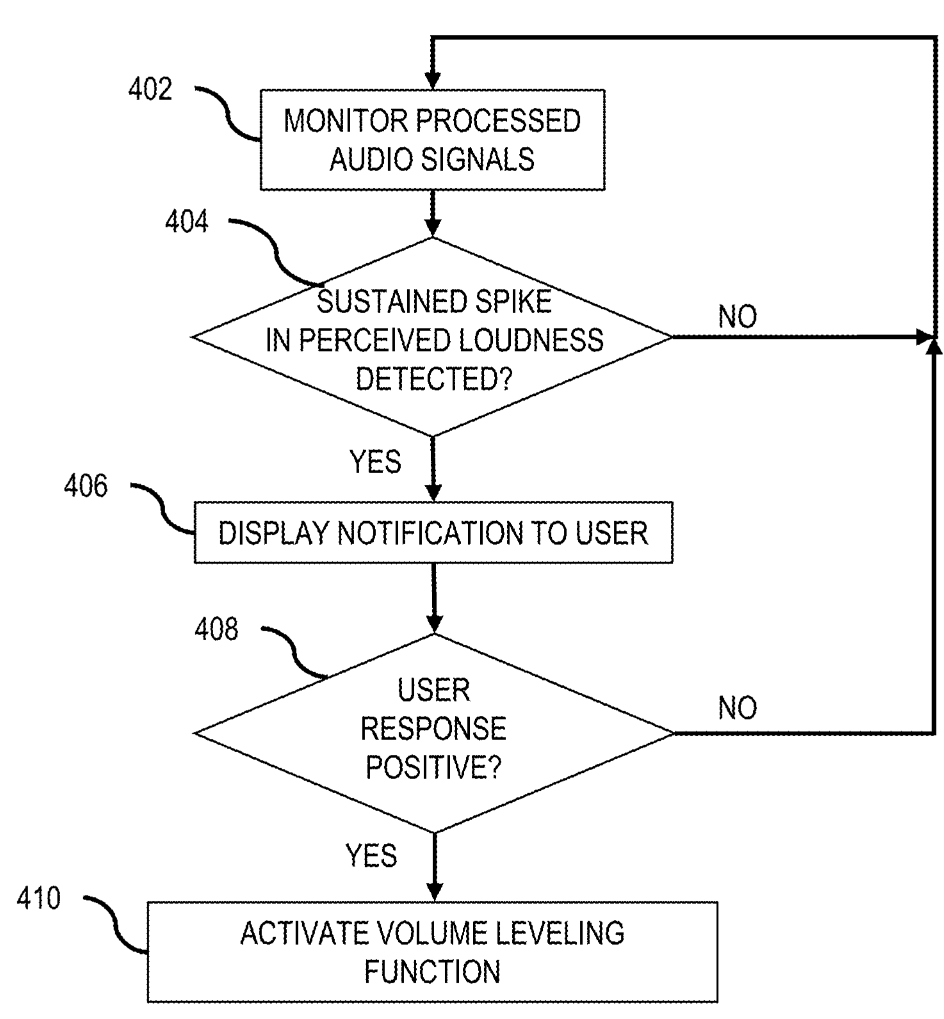
FIG. 4 is a flow chart illustrating an example series of operations that may be performed by the DAVNL system of FIG. 3, according to some embodiments of the disclosure.

Example Techniques for Dynamically Providing Notification of Audio Leveling Functions to a User FIG. 4 is a flow diagram 400 of a set of example operations that may be performed by a DAVNL system, such as DAVNL system 206 (FIGS. 2 and 3) according to some embodiments of the disclosure. In certain embodiments, one or more of the operations illustrated in FIG. 4 may be performed by one or more of the elements illustrated in FIGS. 1-3, for example. For purposes of clarity, the operations of flow diagram 400 may be described below with specific reference to elements of FIGS. 2 and 3.

In an operation 402, the processed audio signals received from audio processing functions 204 (FIG. 2) are monitored using LUFS (e.g., by LUFS module 300 (FIG. 3).

In an operation 404, a determination is made whether a sustained spike, or increase, in perceived loudness of the signal has been detected. This operation insures not only that an increase has been detected (using LUFS to measure the increase), but that the increase is prolonged enough to indicate that it is more than simply a short spike in content audio, for example. If a negative determination is made in operation 404 (either because an increase, or spike, in perceived loudness was not detected or the increase was not sufficiently long), execution returns to operation 402; otherwise, execution proceeds to an operation 406.

In operation 406, a notification is displayed (e.g., by user notification module 306) to the user. In some implementation of operation 406, a determination may be made by the user notification module 306 as to when and where it is appropriate or advisable to display the notification with regard to quality of user experience. In particular embodiments, the notification may convey a question for the user (e.g., "Activating volume leveling may enhance the audio experience. Would you like to activate volume leveling now?") as well as options for response to the question (e.g., "Yes" and "Not Now" or "No"). The user may select one of the response options e.g., using buttons on the remote control.

In an operation 408 a determination is made whether the user has responded positively to the notification (e.g., whether the user has indicated that the user would like to activate volume leveling). If not, execution returns to operation 402; otherwise, execution proceeds to an operation 410.

In operation 410, the volume leveling function is activated.

Although the operations of the example method shown in and described with reference to FIG. 4 are illustrated as occurring once each and in a particular order, it will be recognized that the operations may be performed in any suitable order and repeated as desired. Additionally, one or more operations may be performed in parallel. Furthermore, the operations illustrated in FIG. 4 may be combined or may include more or fewer details than described. For example, in some embodiments, as described in greater detail below, operations 406 and 408 may be omitted and the volume leveling function may be automatically activated in response to a positive determination in operation 404.

Figure 5A:
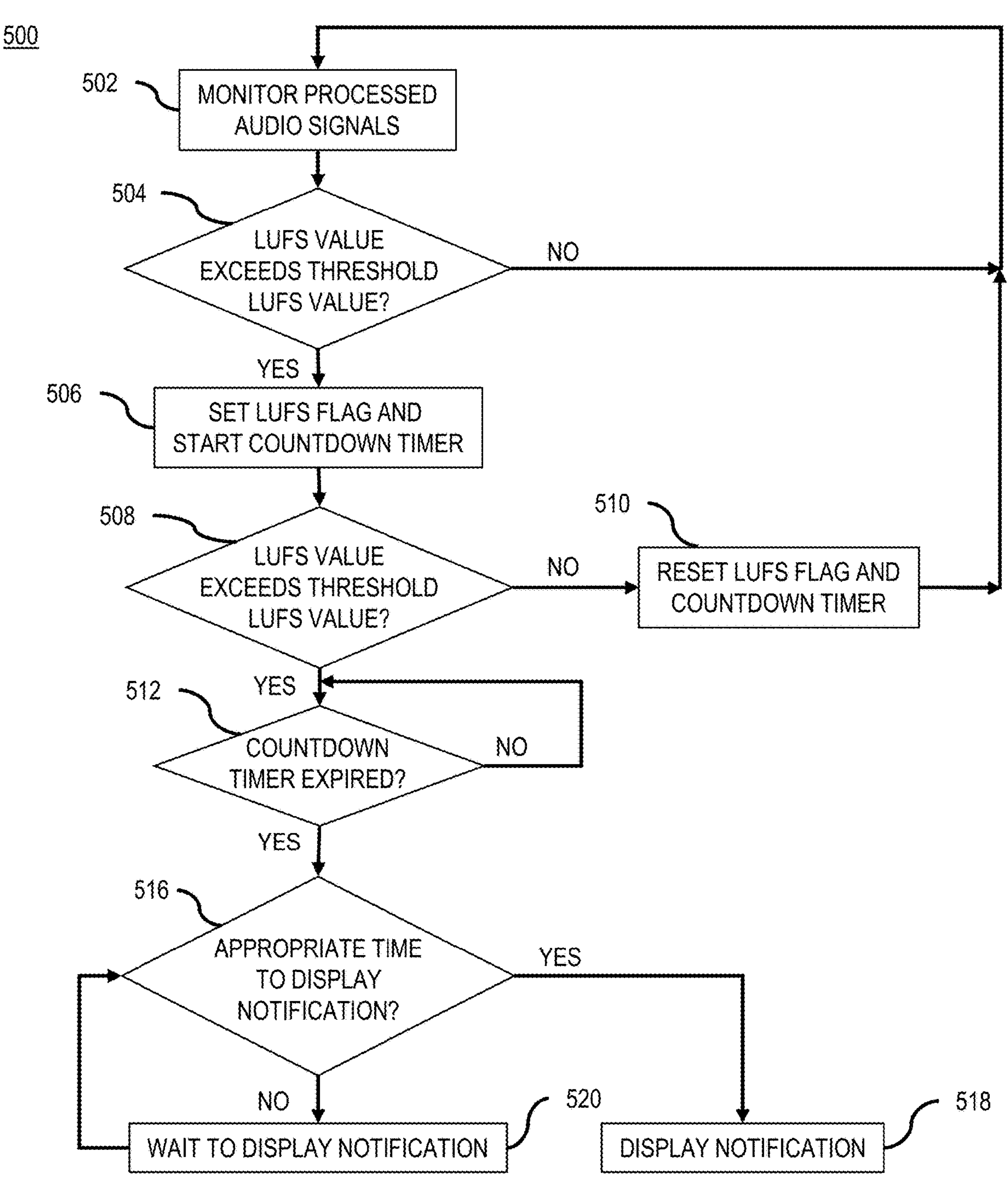
FIG. 5A is a flow chart illustrating a more detailed example series of operations that may be performed by the DAVNL system of FIG. 3, according to some embodiments of the disclosure.

FIG. 5A is a more detailed flow diagram 500 of a set of example operations that may be performed by a DAVNL system, such as DAVNL system 206 (FIGS. 2 and 3) according to some embodiments of the disclosure. In certain embodiments, one or more of the operations illustrated in FIG. 5A may be performed by one or more of the elements illustrated in FIGS. 1-3, for example. For purposes of clarity, the operations of flow diagram 400 may be described below with specific reference to elements of FIGS. 2 and 3. It will be recognized that one or more of the operations below may correspond to one or more of the operations shown in flow diagram 400 (FIG. 4).

In an operation 502, the processed audio signals received from audio processing functions 204 (FIG. 2) are monitored using LUFS (e.g., by LUFS module 300 (FIG. 3).

In an operation 504, a determination is made whether the LUFS value of the audio signal exceeds a threshold LUFS value. If not, execution returns to operation 502; otherwise, execution proceeds to an operation 506.

In operation 506, the LUFS flag (e.g., LUFS flag 302 (FIG. 3)) is set and the countdown timer (e.g., LUFS timer 304 (FIG. 3)) is started.

In an operation 508, a determination is made whether the LUFS value of the audio signal still exceeds the threshold LUFS value. If a negative determination is made in operation 508, execution proceeds to an operation 510; otherwise, execution proceeds to an operation 512.

In operation 510, the LUFS flag and the countdown timer are reset, and execution returns to operation 502.

In operation 512, a determination is made whether the countdown timer has expired. If a negative determination is made in operation 512, execution remains at operation 512; otherwise, execution proceeds to an operation 516.

In operation 516, a determination is made whether it is an appropriate time to display the volume leveling notification to the user. If a positive determination is made in operation 516, execution proceeds to an operation 518; otherwise, execution proceeds to an operation 520.

In operation 518, the notification is displayed to the user.

In operation 520, the system waits to display the notification to the user and execution returns to operation 516.

Although the operations of the example method shown in and described with reference to FIG. 5A are illustrated as occurring once each and in a particular order, it will be recognized that the operations may be performed in any suitable order and repeated as desired. Additionally, one or more operations may be performed in parallel. Furthermore, the operations illustrated in FIG. 5A may be combined or may include more or fewer details than described.

Figure 5B:
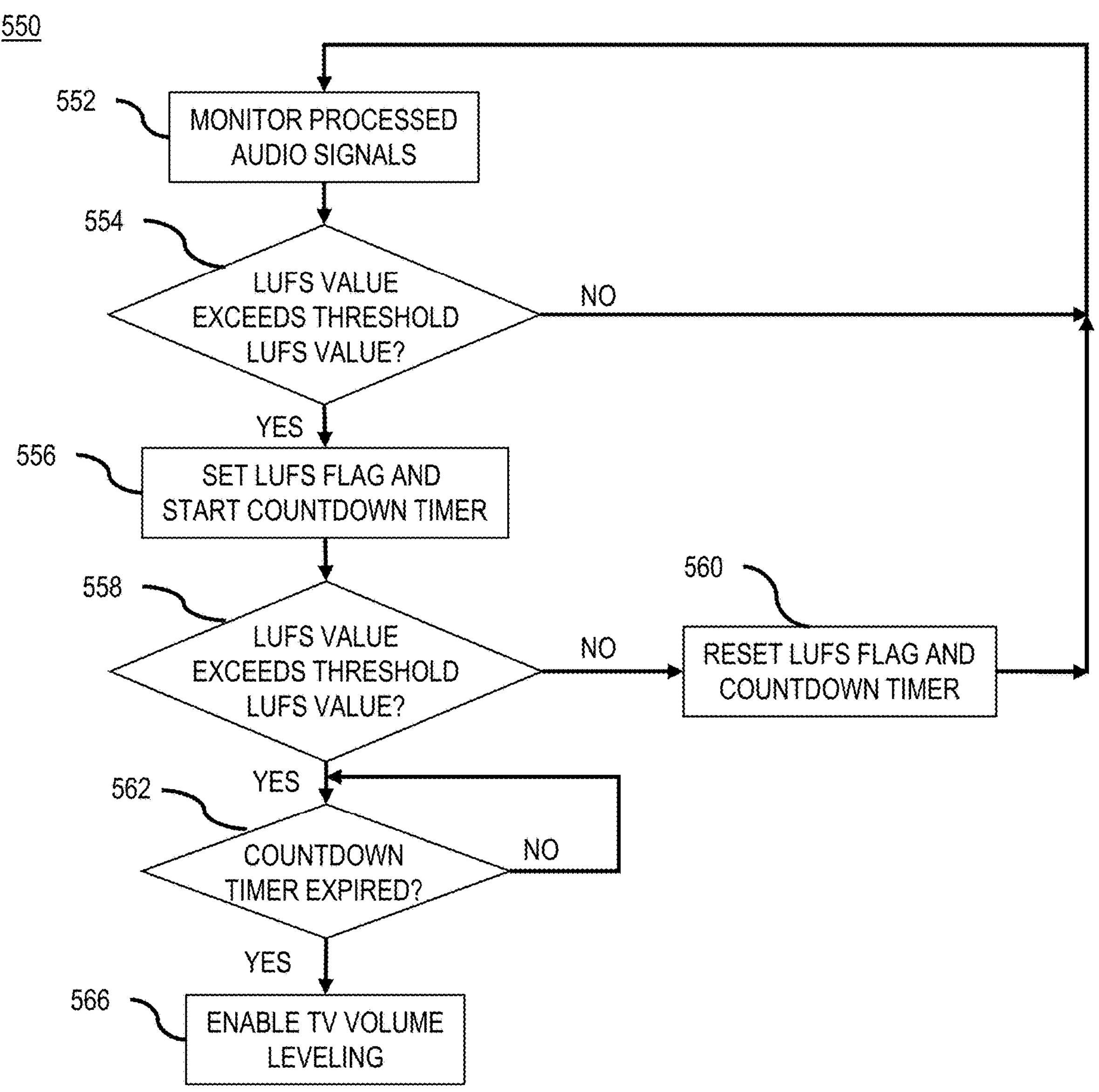
FIG. 5B is a flow chart illustrating a more detailed alternative example series of operations that may be performed by the DAVNL system of FIG. 3, according to some embodiments of the disclosure.

FIG. 5B is a flow diagram 550 of a set of example operations that may be performed by a DAVNL system, such as DAVNL system 206 (FIGS. 2 and 3) according to some embodiments of the disclosure. In certain embodiments, one or more of the operations illustrated in FIG. 4 may be performed by one or more of the elements illustrated in FIGS. 1-3, for example. For purposes of clarity, the operations of flow diagram 550 may be described below with specific reference to elements of FIGS. 2 and 3. It will be recognized that one or more of the operations below may correspond to one or more of the operations shown in flow diagram 400 (FIG. 4).

In an operation 552, the processed audio signals received from audio processing functions 204 (FIG. 2) are monitored using LUFS (e.g., by LUFS module 300 (FIG. 3).

In an operation 554, a determination is made whether the LUFS value of the audio signal exceeds a threshold LUFS value. If not, execution returns to operation 552; otherwise, execution proceeds to an operation 556.

In operation 556, the LUFS flag (e.g., LUFS flag 302 (FIG. 3)) is set and the countdown timer (e.g., LUFS timer 304 (FIG. 3)) is started.

In an operation 558, a determination is made whether the LUFS value of the audio signal still exceeds the threshold LUFS value. If a negative determination is made in operation 558, execution proceeds to an operation 560; otherwise, execution proceeds to an operation 562.

In operation 560, the LUFS flag and the countdown timer are reset, and execution returns to operation 552.

In an operation 562, a determination is made whether the countdown timer has expired. If a negative determination is made in operation 562, execution remains at operation 562; otherwise, execution proceeds to an operation 566.

In operation 566, television volume leveling is enabled.

In the embodiment illustrated in FIG. 5B, the notification function of the DAVLN system (e.g., system 206) may be disabled. Alternatively, an additional step may be performed to notify the user (as described above) that the volume leveling function has been automatically enabled, in which case the user could manually disable the volume leveling function should the user so desire.

Although the operations of the example method shown in and described with reference to FIG. 5B are illustrated as occurring once each and in a particular order, it will be recognized that the operations may be performed in any suitable order and repeated as desired. Additionally, one or more operations may be performed in parallel. Furthermore, the operations illustrated in FIG. 5B may be combined or may include more or fewer details than described.

Embodiments described hereinabove provide a LUFS-based solution to accurately measure the perceived loudness of an audio signal, rather than simply relying on decibel levels (which may not directly equate to perceived loudness). By incorporating context-aware detection, the DAVLN system of the present disclosure can differentiate between regular content and commercials, triggering user notification and/or activation of volume leveling without user notification only when significant and sustained changes in perceived loudness are detected. Additionally, the timing of notifications may be managed to avoid interrupting the viewing experience, being presented during natural breaks or when the television is paused. The DAVLN system thus presents a proactive and intelligent approach that ensures that users are guided to enable volume leveling functionality without unnecessary disruption, significantly enhancing their overall viewing experience.

Embodiments described herein enable an enhanced user experience by dynamically detecting volume discrepancies and providing timely notifications, thereby decreasing the likelihood that users will be startled by sudden loud commercials, resulting in a more consistent and pleasant audio experience. Additionally, embodiments described herein provide increased awareness of the volume leveling feature, of which users may be unaware. As a result, the DAVLN system helps educate users about the volume leveling feature, making it more likely they will use it, thereby improving their overall product satisfaction with regard to the television. Still further, the DAVLN system's ability to determine appropriate times at which to display notifications (e.g., during natural breaks in content or when the TV is paused) ensures that viewing is not disrupted during important or intense moments. Moreover, the DAVLN system reduces the need for users to manually adjust their volume settings, providing a more seamless and hands-free viewing experience. Using LUFS for measuring perceived loudness ensures that the system more accurately reflects the true audio experience of the viewer, compared to decibel measurements. For users with hearing sensitivities or impairments, maintaining consistent audio levels can make content more accessible and enjoyable; as a result, the DAVLN system anticipates and addresses a known point of user frustration, demonstrating a user-centric approach to product design.

Alternative Embodiments

One alternative embodiment includes using external microphone placed in the room to measure the actual sound levels experienced by the viewer. The external microphone could be integrated into the television remote or an integrated smart assistant device. While this embodiment requires additional hardware and may be influenced by other noises in the room, it would measure actual room audio, taking into account all environmental factors.

Another alternative embodiment includes analyzing the metadata of the content to identify commercials therein and to perform volume leveling only during the commercials. While this embodiment requires access to accurate and detailed content metadata, which might not be available, it can provide precise volume adjustments based on known commercial breaks.

Yet another alternative embodiment includes providing a setup wizard to guide users through calibrating their audio settings, including volume leveling, during initial setup of the television or periodically thereafter. While this embodiment requires user intervention and may not fully address dynamic changes during regular viewing, it ensures that users are aware of the volume leveling feature and have configured the feature to their liking.

Example Computing Device

Figure 6:
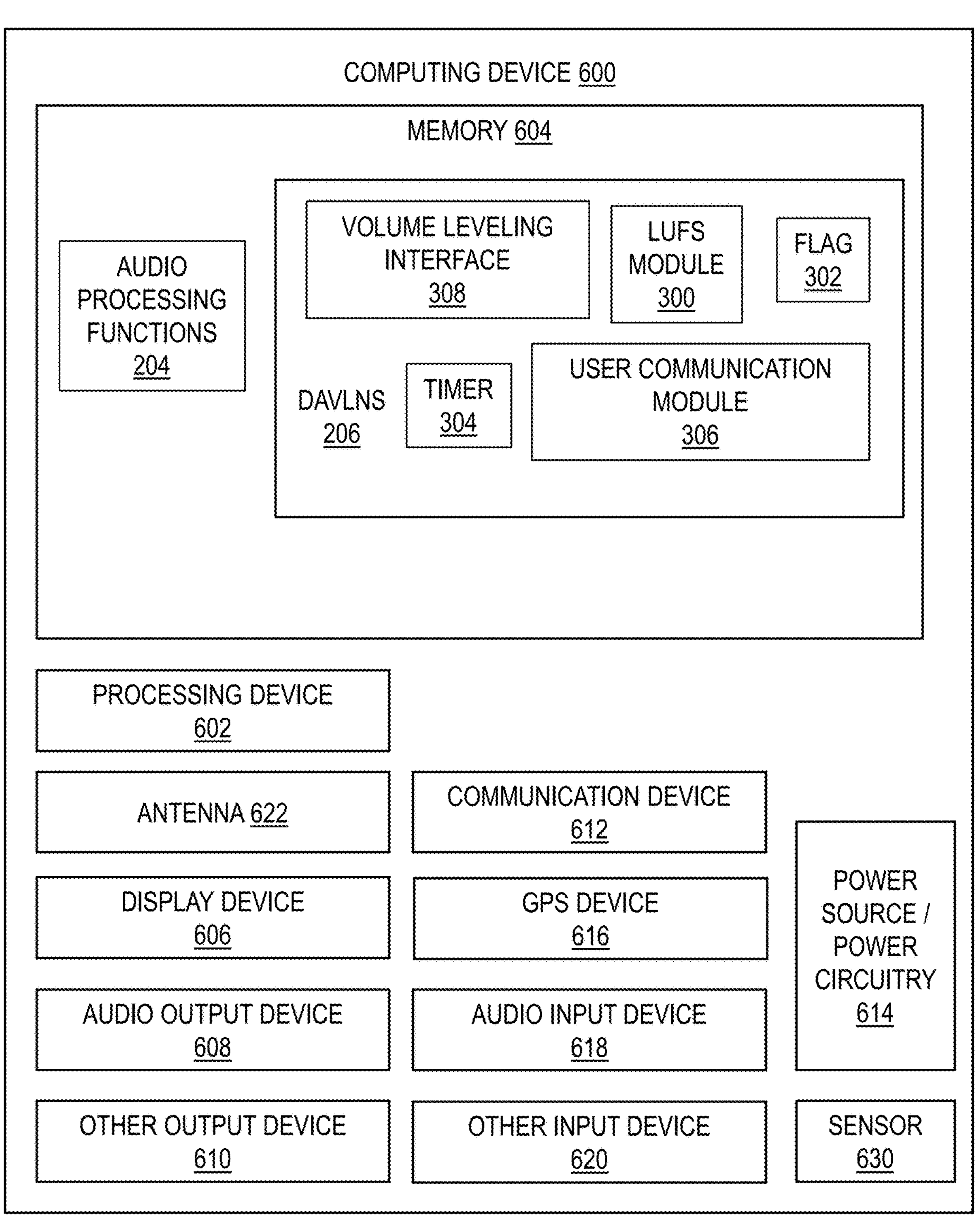
FIG. 6 is a block diagram of an example computing device for implementing various aspects of the example multimedia system of FIG. 1 and/or the example television of FIG. 2, according to some embodiments of the disclosure.

FIG. 6 is a block diagram of an example computing device 600, according to some embodiments of the disclosure. One or more computing devices 600 may be used to implement the functionalities described herein. A number of components are illustrated in the FIGURES as included in the computing device 600; however, it will be recognized that any one or more of these components may be omitted or duplicated, as suitable for the application. In some embodiments, some or all the components included in the computing device 600 may be attached to one or more motherboards. In some embodiments, some or all these components are fabricated onto a single system on a chip (SoC) die. Additionally, in various embodiments, the computing device 600 may not include one or more of the components illustrated in FIG. 6, and the computing device 600 may include interface circuitry for coupling to the one or more components. For example, the computing device 600 may not include a display device 606, and may include display device interface circuitry (e.g., a connector and driver circuitry) to which a display device 606 may be coupled. In another set of examples, the computing device 600 may not include an audio input device 618 or an audio output device 608 and may include audio input or output device interface circuitry (e.g., connectors and supporting circuitry) to which an audio input device 618 or audio output device 608 may be coupled.

The computing device 600 may include a processing device 602 (e.g., one or more processing devices, one or more of the same types of processing device, one or more of different types of processing device). The processing device 602 may include electronic circuitry that process electronic data from data storage elements (e.g., registers, memory, resistors, capacitors, quantum bit cells) to transform that electronic data into other electronic data that may be stored in registers and/or memory. Examples of processing device 602 may include a central processing unit (CPU), a graphical processing unit (GPU), a quantum processor, a machine learning processor, an artificial intelligence processor, a neural network processor, an artificial intelligence accelerator, an application specific integrated circuit (ASIC), an analog signal processor, an analog computer, a microprocessor, a digital signal processor, a field programmable gate array (FPGA), a tensor processing unit (TPU), a data processing unit (DPU), etc.

The computing device 600 may include a memory 604, which may itself include one or more memory devices such as volatile memory (e.g., DRAM), nonvolatile memory (e.g., read-only memory (ROM)), high bandwidth memory (HBM), flash memory, solid state memory, and/or a hard drive. Memory 604 includes one or more non-transitory computer-readable storage media. In some embodiments, memory 604 may include memory that shares a die with the processing device 602.

In some embodiments, memory 604 includes one or more non-transitory computer-readable media storing instructions executable to perform operations described herein and as shown in the FIGURES, such as FIGS. 4, 5A, and 5B.

Memory 604 may store instructions that encode one or more exemplary parts. Exemplary parts that may be encoded as instructions and stored in memory 604 are depicted. Exemplary parts may include one or more components of DAVLN system 206 of FIG. 2. The instructions stored in the one or more non-transitory computer-readable media may be executed by processing device 602. In some embodiments, memory 604 may store data, e.g., data structures, binary data, bits, metadata, files, blobs, etc., as described herein.

In some embodiments, the computing device 600 may include a communication device 612 (e.g., one or more communication devices). For example, the communication device 612 may be configured for managing wired and/or wireless communications for the transfer of data to and from the computing device 600. The term "wireless" and its derivatives may be used to describe circuits, devices, systems, methods, techniques, communications channels, etc., that may communicate data using modulated electromagnetic radiation through a nonsolid medium. The term does not imply that the associated devices do not contain any wires, although in some embodiments they might not. The communication device 612 may implement any of a number of wireless standards or protocols, including but not limited to Institute for Electrical and Electronic Engineers (IEEE) standards including Wi-Fi (IEEE 802.10 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are referred to as WiMAX networks, an acronym that stands for worldwide interoperability for microwave access, which is a certification mark for products that pass conformity and interoperability tests for the IEEE 802.16 standards. The communication device 612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication device 612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication device 612 may operate in accordance with Code-division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication device 612 may operate in accordance with other wireless protocols in other embodiments. The computing device 600 may include an antenna 622 to facilitate wireless communications and/or to receive other wireless communications (such as radio frequency transmissions). The computing device 600 may include receiver circuits and/or transmitter circuits. In some embodiments, the communication device 612 may manage wired communications, such as electrical, optical, or any other suitable communication protocols (e.g., the Ethernet). As noted above, the communication device 612 may include multiple communication chips. For instance, a first communication device 612 may be dedicated to shorter-range wireless communications such as Wi-Fi or Bluetooth, and a second communication device 612 may be dedicated to longer-range wireless communications such as global positioning system (GPS), EDGE, GPRS, CDMA, WiMAX, LTE, EV-DO, or others. In some embodiments, a first communication device 612 may be dedicated to wireless communications, and a second communication device 612 may be dedicated to wired communications.

The computing device 600 may include power source/power circuitry 614. The power source/power circuitry 614 may include one or more energy storage devices (e.g., batteries or capacitors) and/or circuitry for coupling components of the computing device 600 to an energy source separate from the computing device 600 (e.g., DC power, AC power, etc.).

The computing device 600 may include a display device 606 (or corresponding interface circuitry, as discussed above). The display device 606 may include any visual indicators, such as a heads-up display, a computer monitor, a projector, a touchscreen display, a liquid crystal display (LCD), a light-emitting diode display, or a flat panel display, for example.

The computing device 600 may include an audio output device 608 (or corresponding interface circuitry, as discussed above). The audio output device 608 may include any device that generates an audible indicator, such as speakers, headsets, or earbuds, for example.

The computing device 600 may include an audio input device 618 (or corresponding interface circuitry, as discussed above). The audio input device 618 may include any device that generates a signal representative of a sound, such as microphones, microphone arrays, or digital instruments (e.g., instruments having a musical instrument digital interface (MIDI) output).

The computing device 600 may include a GPS device 616 (or corresponding interface circuitry, as discussed above). The GPS device 616 may be in communication with a satellite-based system and may receive a location of the computing device 600, as is known in the art.

The computing device 600 may include a sensor 630 (or one or more sensors). The computing device 600 may include corresponding interface circuitry, as discussed above). Sensor 630 may sense physical phenomenon and translate the physical phenomenon into electrical signals that can be processed by, e.g., processing device 602. Examples of sensor 630 may include: capacitive sensor, inductive sensor, resistive sensor, electromagnetic field sensor, light sensor, camera, imager, microphone, pressure sensor, temperature sensor, vibrational sensor, accelerometer, gyroscope, strain sensor, moisture sensor, humidity sensor, distance sensor, range sensor, time-of-flight sensor, pH sensor, particle sensor, air quality sensor, chemical sensor, gas sensor, biosensor, ultrasound sensor, a scanner, etc.

The computing device 600 may include another output device 610 (or corresponding interface circuitry, as discussed above). Examples of the other output device 610 may include an audio codec, a video codec, a printer, a wired or wireless transmitter for providing information to other devices, haptic output device, gas output device, vibrational output device, lighting output device, home automation controller, or an additional storage device.

The computing device 600 may include another input device 620 (or corresponding interface circuitry, as discussed above). Examples of the other input device 620 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 600 may have any desired form factor, such as a handheld or mobile computer system (e.g., a cell phone, a smart phone, a mobile internet device, a music player, a tablet computer, a laptop computer, a netbook computer, a personal digital assistant (PDA), an ultra-mobile personal computer, a remote control, wearable device, headgear, eyewear, footwear, electronic clothing, etc.), a desktop computer system, a server or other networked computing component, a printer, a scanner, a monitor, a set-top box, an entertainment control unit, a vehicle control unit, a digital camera, a digital video recorder, an Internet-of-Things device (e.g., light bulb, cable, power plug, power source, lighting system, audio assistant, audio speaker, smart home device, smart thermostat, camera monitor device, sensor device, smart home doorbell, motion sensor device), a virtual reality system, an augmented reality system, a mixed reality system, or a wearable computer system. In some embodiments, the computing device 600 may be any other electronic device that processes data.

Select Examples

Example 1 provides a computer-implemented method including monitoring an audio signal received at a television to detect a sustained increase in a perceived loudness of the audio signal; subsequent to the detecting, providing a notification to a user regarding availability of a television volume leveling function; and subsequent to receiving from the user a response to the notification, in which the response indicates an approval to activate the television volume leveling function, activating the television volume leveling function.

Example 2 provides the computer-implemented method of example 1, in which the providing the notification includes displaying the notification on the television.

Example 3 provides the computer-implemented method of example 1 or 2, in which the audio signal includes content audio and commercial audio.

Example 4 provides the computer-implemented method of any one of examples 1-3, further including, prior to the providing, determining a time at which to provide the notification and in which the providing includes providing the notification at the determined time.

Example 5 provides the computer-implemented method of example 4, in which the determining the time includes detecting a commercial break in the audio signal.

Example 6 provides the computer-implemented method of example 4 or 5, in which the determining the time includes detecting that presentation of content including the audio signal has been paused.

Example 7 provides the computer-implemented method of any one of examples 1-6, in which the monitoring is performed using Loudness Units relative to Full Scale (LUFS).

Example 8 provides the computer-implemented method of any one of examples 1-7, in which the response is provided using a remote control associated with the television.

Example 9 provides the computer-implemented method of any one of examples 1-8, in which the notification includes a notice to the user that the television volume leveling function has been enabled.

Example 10 provides one or more non-transitory computer-readable media storing instructions that, when executed by one or more processors, cause the one or more processors to: receive at a television an audio signal including content audio and commercial audio; monitor the audio signal to detect a sustained increase in a perceived loudness of the audio signal, in which the monitoring is performed using Loudness Units relative to Full Scale (LUFS); and subsequent to the detecting, apply a volume leveling function to the audio signal prior to providing the audio signal to at least one speaker connected to the television.

Example 11 provides the one or more non-transitory computer-readable media of example 10, in which the instructions further cause the one or more processors to, prior to the applying, provide a notification to a user regarding availability of a television volume leveling function.

Example 12 provides the one or more non-transitory computer-readable media of example 11, in which the instructions further cause the one or more processors to, subsequent to the providing and prior to the applying, await a response to the notification including an approval to activate the television volume leveling function.

Example 13 provides the one or more non-transitory computer-readable media of example 11 or 12, in which the providing the notification includes displaying the notification on the television.

Example 14 provides the one or more non-transitory computer-readable media of any one of examples 11-13, in which the instructions further cause the one or more processors to, prior to the providing, determine a time at which to provide the notification and in which the providing includes providing the notification at the determined time.

Example 15 provides the one or more non-transitory computer-readable media of example 14, in which the determining the time includes detecting a commercial break in the audio signal.

Example 16 provides the one or more non-transitory computer-readable media of example 14 or 15, in which the determining the time includes detecting that presentation of content including the audio signal has been paused.

Example 17 provides a television system, including an audio processing module for processing audio signals received by the television system, in which the audio signals include content audio and commercial audio; an audio volume leveling notification (AVLN) system electrically connected to receive the audio signals from the audio processing module; a volume leveling function for leveling a volume of the audio signals when the volume leveling function is activated; and at least one speaker, in which the AVLN system is further configured to: monitor the audio signals to detect a sustained increase in a perceived loudness of the audio signals, in which the monitoring is performed using Loudness Units relative to Full Scale (LUFS); subsequent to the detecting, displaying a notification to a user regarding availability of the volume leveling function; and, subsequent to receiving from the user a response to the notification, in which the response indicates an approval to activate the television volume leveling function, enable the volume leveling function.

Example 18 provides the television system of example 17, in which the AVLN system is further configured to determine a time at which to display the notification and in which the displaying the notification is performed at the determined time.

Example 19 provides the television system of example 18, in which the determining includes at least one of detecting a commercial break in the audio signals and detecting that presentation of content including the audio signals has been paused.

Example 20 provides the television system of any one of examples 17-19, further including a remote control unit, in which the response is provided using the remote control unit.

Variations and Other Notes

Although the operations of the example methods shown in and described with reference to the FIGS. are illustrated as occurring once each and in a particular order, it will be recognized that the operations may be performed in any suitable order and repeated as desired. Additionally, one or more operations may be performed in parallel. Furthermore, the operations illustrated in the FIGS. may be combined or may include more or fewer details than described.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure considering the above detailed description.

For purposes of explanation, specific numbers, materials, and configurations are set forth to provide a thorough understanding of the illustrative implementations. However, it will be apparent to one skilled in the art that the present disclosure may be practiced without the specific details and/or that the present disclosure may be practiced with only some of the described aspects. In other instances, well known features are omitted or simplified in order not to obscure the illustrative implementations.

Further, references are made to the accompanying drawings that form a part hereof, and in which are shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. These operations may not be performed in the order of presentation. Operations described may be performed in a different order from the described embodiment. Various additional operations may be performed or described operations may be omitted in additional embodiments.

For the purposes of the present disclosure, the phrase "A or B" or the phrase "A and/or B" means (A), (B), or (A and B). For the purposes of the present disclosure, the phrase "A, B, or C" or the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicates that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

The terms "substantially," "close," "approximately," "near," and "about," refer to being within +/−20% of a target value as described herein or as known in the art. Similarly, terms indicating orientation of various elements, e.g., "coplanar," "perpendicular," "orthogonal," "parallel," or any other angle between the elements, refer to being within +/−5-20% of a target value as described herein or as known in the art.

In addition, the terms "comprise," "comprising," "include," "including," "have," "having" or any other variation thereof, are intended to cover a non-exclusive inclusion. For example, a method, process, or device, that comprises a list of elements is not necessarily limited to only those elements but may include other elements not expressly listed or inherent to such method, process, or device. Also, the term "or" refers to an inclusive "or" and not to an exclusive "or."

The systems, methods, and devices of this disclosure each have several innovative aspects, no single one of which is solely responsible for all desirable attributes disclosed herein. Details of one or more implementations of the subject matter described in this specification are set forth in the description and the accompanying drawings.

What is claimed is:

1. A computer-implemented method comprising:

monitoring an audio signal received at a television to detect a sustained increase in a perceived loudness of the audio signal, using Loudness Units relative to Full Scale (LUFS), wherein the audio signal includes content audio and commercial audio;

subsequent to the detecting, providing a notification to a user regarding availability of a television volume leveling function; and subsequent to receiving from the user a response to the notification, wherein the response indicates an approval to activate the television volume leveling function, activating the television volume leveling function.

2. The computer-implemented method of claim 1, wherein the providing the notification comprises displaying the notification on the television.

3. The computer-implemented method of claim 1, further comprising, prior to the providing, determining a time at which to provide the notification and wherein the providing comprises providing the notification at the determined time.

4. The computer-implemented method of claim 3, wherein the determining the time comprises detecting a commercial break in the audio signal.

5. The computer-implemented method of claim 3, wherein the determining the time comprises detecting that presentation of content comprising the audio signal has been paused.

6. The computer-implemented method of claim 1, wherein the response is provided using a remote control associated with the television.

7. The computer-implemented method of claim 1, wherein the notification comprises a notice to the user that the television volume leveling function has been enabled.

8. One or more non-transitory computer-readable media storing instructions that, when executed by one or more processors, cause the one or more processors to:

receive at a television an audio signal comprising content audio and commercial audio;

monitor the audio signal to detect a sustained increase in a perceived loudness of the audio signal, wherein the monitoring is performed using Loudness Units relative to Full Scale (LUFS);

subsequent to the detecting, provide a notification to a user regarding availability of a television volume leveling function; and subsequent to receiving from the user a response to the notification, apply a volume leveling function to the audio signal prior to providing the audio signal to at least one speaker connected to the television.

9. The one or more non-transitory computer-readable media of claim 8, wherein the instructions further cause the one or more processors to, subsequent to the providing and prior to the applying, await a response to the notification comprising an approval to activate the television volume leveling function.

10. The one or more non-transitory computer-readable media of claim 8, wherein the providing the notification comprises displaying the notification on the television.

11. The one or more non-transitory computer-readable media of claim 8, wherein the instructions further cause the one or more processors to, prior to the providing, determine a time at which to provide the notification and wherein the providing comprises providing the notification at the determined time.

12. The one or more non-transitory computer-readable media of claim 11, wherein the determining the time comprises detecting a commercial break in the audio signal.

13. The one or more non-transitory computer-readable media of claim 11, wherein the determining the time comprises detecting that presentation of content comprising the audio signal has been paused.

14. A television system, comprising:

an audio processing module for processing audio signals received by the television system, wherein the audio signals comprise content audio and commercial audio;

an audio volume leveling notification (AVLN) system electrically connected to receive the audio signals from the audio processing module;

a volume leveling function for leveling a volume of the audio signals when the volume leveling function is activated; and at least one speaker, wherein the AVLN system is further configured to:

monitor the audio signals to detect a sustained increase in a perceived loudness of the audio signals, wherein the monitoring is performed using Loudness Units relative to Full Scale (LUFS);

subsequent to the detecting, displaying a notification to a user regarding availability of the volume leveling function; and, subsequent to receiving from the user a response to the notification, wherein the response indicates an approval to activate the television volume leveling function, enable the volume leveling function.

15. The television system of claim 14, wherein the AVLN system is further configured to determine a time at which to display the notification and wherein the displaying the notification is performed at the determined time.

16. The television system of claim 15, wherein the determining comprises at least one of detecting a commercial break in the audio signals and detecting that presentation of content comprising the audio signals has been paused.

17. The television system of claim 14, further comprising a remote control unit, wherein the response is provided using the remote control unit.

18. The television system of claim 14, wherein the AVLN system is further configured to, responsive to detecting that a LUFS value exceeds a threshold LUFS value, set a loudness flag and start a timer, and to determine that the sustained increase is detected based on expiration of the timer while the LUFS value remains above the threshold.

19. The television system of claim 18, wherein the AVLN system is further configured to reset the loudness flag and the timer responsive to determining that the LUFS value falls below the threshold LUFS value before the timer expires.

20. The television system of claim 18, wherein the timer comprises a countdown timer having a duration selected to distinguish momentary content spikes from commercial loudness.

* * * * *